United States Patent
Yu et al.

(10) Patent No.: US 12,506,475 B2
(45) Date of Patent: Dec. 23, 2025

(54) HYBRID SWITCH CIRCUIT WITH BIDIRECTIONAL DOUBLE-BASE BIPOLAR JUNCTION TRANSISTORS

(71) Applicant: IDEAL POWER INC., Austin, TX (US)

(72) Inventors: Ruiyang Yu, Austin, TX (US); Jiankang Bu, Austin, TX (US); Yifan Jiang, Austin, TX (US); R. Daniel Brdar, Driftwood, TX (US); Mudit Khanna, Austin, TX (US)

(73) Assignee: IDEAL POWER INC., Austin, TX (US)

( * ) Notice: Subject to any disclaimer, the term of this patent is extended or adjusted under 35 U.S.C. 154(b) by 77 days.

(21) Appl. No.: 18/458,790

(22) Filed: Aug. 30, 2023

(65) Prior Publication Data
US 2025/0080107 A1    Mar. 6, 2025

(51) Int. Cl.
*H03K 17/567*     (2006.01)
*H03K 17/12*      (2006.01)

(52) U.S. Cl.
CPC ......... *H03K 17/567* (2013.01); *H03K 17/127* (2013.01); *H03K 2217/0036* (2013.01)

(58) Field of Classification Search
CPC ............. H03K 17/567; H03K 17/127; H03K 2217/0036
See application file for complete search history.

(56) References Cited

U.S. PATENT DOCUMENTS

| | | | |
|---|---|---|---|
| 7,220,661 B1 | 5/2007 | Yu et al. |
| 7,599,196 B2 | 10/2009 | Alexander |
| 7,778,045 B2 | 8/2010 | Alexander |
| 8,295,069 B2 | 10/2012 | Alexander |
| 8,300,426 B2 | 10/2012 | Alexander |
| 8,345,452 B2 | 1/2013 | Alexander |
| 8,391,033 B2 | 3/2013 | Alexander |
| 8,395,910 B2 | 3/2013 | Alexander |
| 8,400,800 B2 | 3/2013 | Alexander |
| 8,406,025 B1 | 3/2013 | Alexander |
| 8,432,711 B1 | 4/2013 | Alexander |

(Continued)

OTHER PUBLICATIONS

International Search Report and Written Opinion mailed Sep. 11, 2024 having International Application No. PCT/US24/34273.

(Continued)

*Primary Examiner* — Metasebia T Retebo
(74) *Attorney, Agent, or Firm* — Dickinson Wright PLLC

(57) ABSTRACT

A hybrid switch circuit for coupling two circuit terminals together is disclosed. The hybrid switch circuit includes a set of bidirectional switch devices coupled between a first circuit terminal and a second circuit terminal. The hybrid switch circuit also includes a set of unidirectional switch devices that are also coupled between the first circuit terminal and the second circuit terminal. In some cases, the set of bidirectional switch devices may be implemented using bidirectional double-base bipolar junction transistors, while the set of unidirectional switch devices may be implemented using wide bandgap transistors. In response to a de-assertion of a switch signal, a control circuit may open the set of bidirectional switch devices and, after a period of time has elapsed, open the set of unidirectional switch devices.

20 Claims, 9 Drawing Sheets

(56) References Cited

U.S. PATENT DOCUMENTS

| | | |
|---|---|---|
| 8,441,819 B2 | 5/2013 | Alexander |
| 8,446,042 B2 | 5/2013 | Bundschuh et al. |
| 8,446,745 B1 | 5/2013 | Alexander |
| 8,451,637 B1 | 5/2013 | Alexander |
| 8,461,718 B2 | 6/2013 | Bundschuh et al. |
| 8,471,408 B2 | 6/2013 | Bundschuh et al. |
| 8,514,601 B2 | 8/2013 | Alexander |
| 8,531,858 B2 | 9/2013 | Alexander |
| 9,007,796 B2 | 4/2015 | Alexander |
| 9,029,909 B2 | 5/2015 | Blanchard et al. |
| 9,035,350 B2 | 5/2015 | Blanchard et al. |
| 9,042,131 B2 | 5/2015 | Barron et al. |
| 9,054,706 B2 | 6/2015 | Blanchard et al. |
| 9,054,707 B2 | 6/2015 | Blanchard et al. |
| 9,059,710 B2 | 6/2015 | Blanchard et al. |
| 9,077,185 B2 | 7/2015 | Alexander |
| 9,118,247 B2 | 8/2015 | Alexander |
| 9,130,461 B2 | 9/2015 | Alexander |
| 9,159,819 B2 | 10/2015 | Pfirsch et al. |
| 9,190,894 B2 | 11/2015 | Alexander et al. |
| 9,203,400 B2 | 12/2015 | Alexander et al. |
| 9,203,401 B2 | 12/2015 | Alexander et al. |
| 9,209,713 B2 | 12/2015 | Alexander et al. |
| 9,209,798 B2 | 12/2015 | Alexander et al. |
| 9,231,582 B1 | 1/2016 | Alexander et al. |
| 9,270,142 B2 | 2/2016 | Alexander |
| 9,293,946 B2 | 3/2016 | Alexander |
| 9,337,262 B2 | 5/2016 | Blanchard |
| 9,355,353 B2 | 5/2016 | Von Mueller et al. |
| 9,355,853 B2 | 5/2016 | Blanchard et al. |
| 9,356,595 B2 | 5/2016 | Alexander et al. |
| 9,647,553 B2 | 5/2017 | Alexander et al. |
| 9,742,385 B2 | 8/2017 | Alexander |
| 9,742,395 B2 | 8/2017 | Alexander et al. |
| 9,787,298 B2 | 10/2017 | Alexander et al. |
| 9,818,615 B2 | 11/2017 | Blanchard et al. |
| 9,899,932 B2 | 2/2018 | Alexander |
| 10,056,372 B2 | 8/2018 | Alexander |
| 10,211,283 B2 | 2/2019 | Alexander et al. |
| 10,418,471 B2 | 9/2019 | Alexander et al. |
| 10,497,699 B2 | 12/2019 | Alexander |
| 10,580,885 B1 | 3/2020 | Alexander et al. |
| 10,892,354 B2 | 1/2021 | Alexander et al. |
| 11,069,797 B2 | 7/2021 | Blanchard et al. |
| 11,411,557 B2 | 8/2022 | Mojab |
| 11,496,129 B2 | 11/2022 | Mojab |
| 11,522,051 B2 | 12/2022 | Mojab et al. |
| 11,637,016 B2 | 4/2023 | Blanchard et al. |
| 11,699,746 B2 | 7/2023 | Blanchard et al. |
| 11,777,018 B2 | 10/2023 | Blanchard et al. |
| 11,804,835 B2 | 10/2023 | Mojab |
| 11,881,525 B2 | 1/2024 | Bu et al. |
| 2012/0051100 A1 | 3/2012 | Alexander |
| 2012/0279567 A1 | 11/2012 | Alexander |
| 2013/0307336 A1 | 11/2013 | Bundschuh et al. |
| 2013/0314096 A1 | 11/2013 | Bundschuh et al. |
| 2014/0319911 A1 | 10/2014 | Alexander |
| 2015/0061569 A1 | 3/2015 | Alexander et al. |
| 2015/0214782 A1 | 7/2015 | Alexander |
| 2015/0222146 A1 | 8/2015 | Alexander |
| 2015/0222194 A1 | 8/2015 | Bundschuh |
| 2015/0318704 A1 | 11/2015 | Barron et al. |
| 2016/0322350 A1 | 11/2016 | Blanchard |
| 2016/0322484 A1 | 11/2016 | Blanchard |
| 2016/0344300 A1 | 11/2016 | Alexander |
| 2017/0126225 A1 | 5/2017 | Alexander et al. |
| 2017/0288561 A1 | 10/2017 | Lemberg et al. |
| 2017/0317575 A1 | 11/2017 | Alexander |
| 2018/0026122 A1 | 1/2018 | Blanchard et al. |
| 2018/0109101 A1 | 4/2018 | Alexander |
| 2018/0226254 A1 | 8/2018 | Blanchard et al. |
| 2019/0140548 A1 | 5/2019 | Alexander |
| 2019/0267810 A1 | 8/2019 | Johns |
| 2020/0006945 A1 | 1/2020 | Lemberg et al. |
| 2021/0351178 A1 | 11/2021 | Wood |
| 2021/0359678 A1 | 11/2021 | Mojab |
| 2021/0384900 A1* | 12/2021 | Mojab ................... H02M 11/00 |
| 2022/0190115 A1* | 6/2022 | Mojab .............. H03K 17/08126 |
| 2022/0311326 A1* | 9/2022 | Szczeszynski .......... H02M 3/07 |
| 2023/0066664 A1 | 3/2023 | Mojab et al. |
| 2023/0299188 A1 | 9/2023 | Blanchard et al. |
| 2023/0386987 A1 | 11/2023 | Bu et al. |

OTHER PUBLICATIONS

Deshpande, Amol, et al., "Practical Design Considerations for a Si IGBT + SiC MOSFET Hybrid Switch: Parasitic Interconnect Influences, Cost, and Current Ratio Optimization", Power Electronics, vol. 34, No. 1, Jan. 2019, 14 pages.

Zhao, Tiefu, et al., "An Optimal Switching Pattern for "SiC+Si" Hybrid Device Based Voltage Source Converters", Applied Power Electronics Conference and Exposition (APEC), Mar. 2015, 6 pages.

* cited by examiner

HYBRID SWITCH CIRCUIT WITH BIDIRECTIONAL DOUBLE-BASE BIPOLAR JUNCTION TRANSISTORS

BACKGROUND

Technical Field

This disclosure is related to electrically controlled switches and, more particularly, to hybrid switches that include bidirectional double-base bipolar junction transistors ("BDB BJT").

Description of the Related Art

Many electrical systems make use of high voltages and currents. Such electrical systems may be employed in a variety of applications ranging from electric vehicles to consumer appliances. For example, in some electric vehicles, voltages on the order of 1200 volts may be used to power electric motors.

During operation of such electrical systems, it may be necessary to disconnect or decouple a load circuit from a high-voltage source. To accomplish this, electrically controlled switches may be employed. In response to an assertion of a switch signal, an electrically controlled switch can couple a power source to a load circuit. The electrically controlled switch can additionally decouple the load circuit from the power source in response to a de-assertion of the switch signal.

SUMMARY

Various embodiments of a hybrid switch circuit are disclosed. Broadly speaking, a hybrid switch circuit may include a first set of bidirectional switch devices configured to couple a first terminal to a second terminal in response to an assertion of a plurality of first control signals. The hybrid switch circuit may further include a second set of unidirectional switch devices configured to couple the first terminal to the second terminal in response to an assertion of a plurality of second control signals. A control circuit may be configured, in response to a de-assertion of a switch signal, to de-assert the plurality of first control signals, and de-assert the plurality of second control signals after a time period has elapsed since the plurality of first control signals were de-asserted.

In some embodiments, the first set of bidirectional switch devices may include a plurality of double-base bipolar junction transistors coupled in parallel between the first terminal and the second terminal.

In other embodiments, the second set of unidirectional switch devices may include a plurality of wide bandgap transistors coupled in series between the first terminal and the second terminal.

BRIEF DESCRIPTION OF THE DRAWINGS

For a detailed description of example embodiments, reference will now be made to the accompanying drawings in which.

Figure 1:
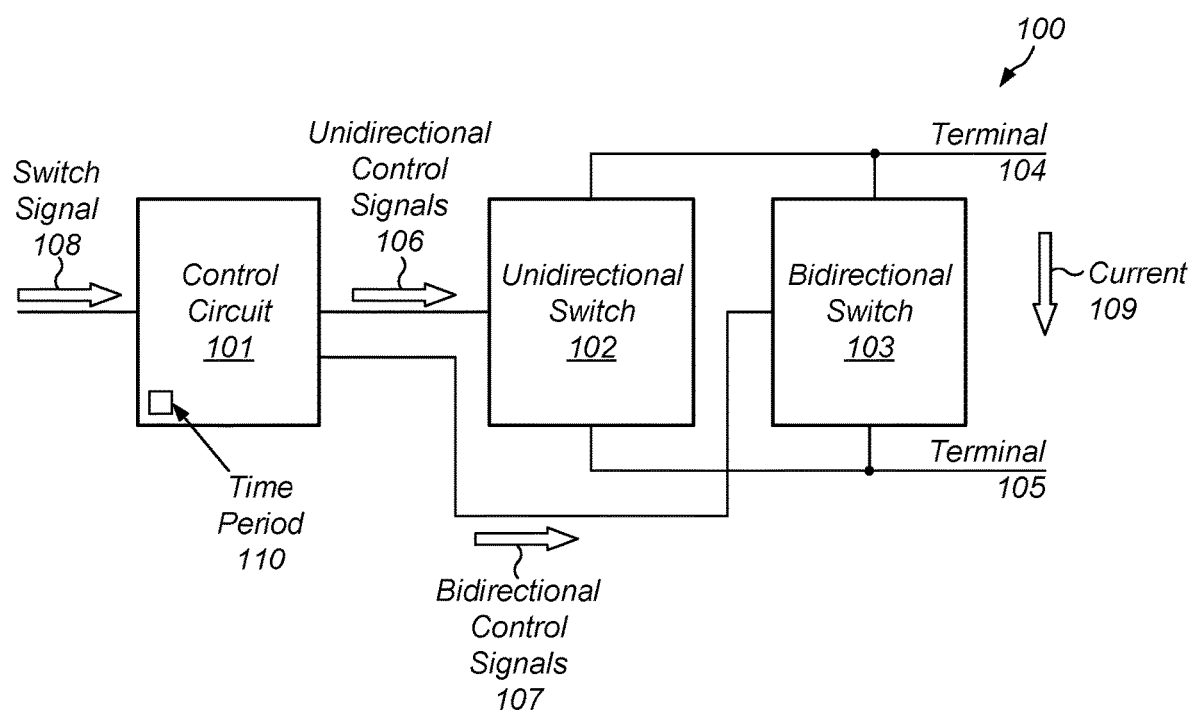
FIG. 1 is block diagram of an embodiment of a hybrid switch circuit.

Many of the electrical connections in the drawings are shown as direct couplings having no intervening devices, but not expressly stated as such in the following description. Nevertheless, this paragraph shall serve as antecedent basis in the claims for referencing any electrical connection as "directly coupled" for electrical connections shown in the drawing with no intervening device(s).

Definitions

Various terms are used to refer to particular system components. Different companies may refer to a component by different names—this document does not intend to distinguish between components that differ in name but not function. In the following discussion and in the claims, the terms "including" and "comprising" are used in an open-ended fashion and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"A," "an," and "the," as used herein, refers to both singular and plural referents unless the context clearly dictates otherwise. By way of example, "a processor" programmed to perform various functions refers to one processor programmed to perform each and every function, or more than one processor collectively programmed to perform each of the various functions.

In relation to electrical devices (whether stand alone or as part of an integrated circuit), the terms "input" and "output" refer to electrical connections to the electrical devices, and shall not be read as verbs requiring action. For example, a differential amplifier (such as an operational amplifier) may have a first differential input and a second differential input, and these "inputs" define electrical connections to the operational amplifier, and shall not be read to require inputting signals to the operational amplifier.

"Assert" shall mean creating or maintaining a first predetermined state of a Boolean signal. Boolean signals may be asserted high, or with a higher voltage, and Boolean signals may be asserted low, or with a lower voltage, at the discretion of the circuit designer. Similarly, "de-assert" shall mean creating or maintaining a second predetermined state of the Boolean signal, opposite the asserted state.

"FET" shall mean a field-effect transistor, such as a junction-gate FET (JFET) or a metal-oxide semiconductor field effect transistor (MOSFET).

"Closing" in reference to an electrically controlled switch (e.g., a FET) shall mean making the electrically controlled switch conductive. For example, closing a FET used as an electrically controlled switch may mean driving the FET to a full conductive state.

"Opening" in reference to an electrically controlled switch (e.g., a FET) shall mean making the electrically controlled switch non-conductive.

"Bidirectional double-base bipolar junction transistor" shall mean a junction transistor having a base and a collector-emitter on a first face, or first side, of a bulk region, and having a base and a collector-emitter on a second face, or second side, of the bulk region. The base and collector-emitter on the first side are distinct from the base and the collector-emitter on the second side.

"Upper collector-emitter" shall mean a terminal connected to a collector-emitter of a bidirectional double-base bipolar junction transistor on a first side of a bulk region of the transistor, and shall not be read to imply a location of the collector-emitter with respect to gravity.

"Lower collector-emitter" shall mean a terminal connected to a collector-emitter of a bidirectional double-base bipolar junction transistor on a second side of a bulk region of the transistor opposite a first side, and shall not be read to imply a location of the collector-emitter with respect to gravity.

"Upper base" shall mean a terminal connect to a base of a bidirectional double-base bipolar junction transistor on a first side of the transistor, and shall not be read to imply a location of the base with respect to gravity.

"Lower base" shall mean a terminal connected to a base of a bidirectional double-base bipolar junction transistor on a second side of the transistor opposite a first side, and shall not be read to imply a location of the base with respect to gravity.

"Controller" or "controller circuit" shall mean, alone or in combination, individual circuit components, an application specific integrated circuit (ASIC), a microcontroller with controlling software, a reduced-instruction-set computing (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

In various applications, switching of high voltages and currents may be needed. For example, in some electric vehicles, coupling and decoupling a load circuit to a high voltage supply (e.g., 1200V) may be common. In many systems, silicon carbide (SiC) switches are employed. To handle large currents, many SiC switches may be coupled together in parallel so that each SiC handles only a portion of the overall current.

Using multiple SiC switches, however, can result in a large circuit area and higher cost. Additionally, increased drive capability needs to be added to the switch control signals used to control the multiple SiC switches, increasing power consumption and decreasing efficiency of the switch sub-system.

To reduce the number of SiC switches needed, a hybrid switch includes both SiC switches and bidirectional double-base bipolar junction transistors. The higher current carrying capacity of the bidirectional double-base bipolar junction transistors enables the use of fewer total switch circuit elements for a given current. Bidirectional double-base bipolar junction transistors, however, transition more slowly from an open state to a closed state than SiC switches. During this time, there is a large voltage across the bidirectional double-base bipolar junction transistors in additional to current flowing through them, resulting in undesirable power consumption, which decreases the efficiency of the switch sub-system.

The embodiments described herein may provide techniques for operating a hybrid switch to reduce power dissipation and improve efficiency. In response to receiving an indication to open, the hybrid switch may open the bidirectional double-base bipolar junction transistors while leaving the SiC switches closed. With the SiC switches closed, the voltage across the bidirectional double-base bipolar junction transistors is reduced while they transition from closed to open. After a period of time has elapsed, the hybrid switch opens the SiC switches. Since the SiC switches have a relatively fast transition time, the time the hybrid switch is dissipating power is reduced.

A block diagram of an embodiment of a hybrid switch circuit is depicted in FIG. 1. As illustrated, hybrid switch circuit 100 includes control circuit 101, unidirectional switch 102, and bidirectional switch 103.

Bidirectional switch 103 is configured to couple terminal 104 to terminal 105 in response to bidirectional control signals 107 being placed in a particular state. It is noted that in some embodiments, one or more of bidirectional control signals 107 may be electrically floated. As described below, bidirectional switch 103 may include multiple BDB BJT devices that can be placed in different operational states or modes. In some embodiments, the different modes may include multiple open and closed modes, which may be selected based on an application for which hybrid switch circuit 100 is being employed. Each mode may, in various embodiments, correspond to a particular state of bidirectional control signals 107.

In a similar fashion, unidirectional switch 102 is configured to couple terminal 104 to terminal 105 in response to an assertion of unidirectional control signals 106. It is noted that although both bidirectional control signals 107 and unidirectional control signals 106 are depicted as single wires, in various embodiments, each of bidirectional control signals 107 and unidirectional control signals 106 may include multiple wires used to transmit different voltages and/or currents to unidirectional switch 102 and bidirectional switch 103.

When unidirectional switch 102 and bidirectional switch 103 are closed, current 109 can flow between terminal 104 and terminal 105. It is noted that although current 109 is depicted as flowing from terminal 104 to terminal 105, in other embodiments, different arrangements of circuits coupled to terminals 104 and 105 can result in current 109 flowing in the opposite direction.

Control circuit 101 is configured, in response to a de-assertion of switch signal 108, to place bidirectional control signals 107 in a state corresponding to an open mode of bidirectional switch 103. In various embodiments, control circuit 101 is further configured to de-assert unidirectional control signals 106 after time period 110 has elapsed since bidirectional switch 103 was placed in an open mode.

Additionally, control circuit 101 is also configured, in response to an assertion of switch signal 108, to assert unidirectional control signals 106 in order to close unidirectional switch 102, and place bidirectional control signals 107 in a state corresponding to a closed mode of bidirectional switch 103. Once unidirectional switch 102 and bidirectional switch 103 are closed, current 109 can flow between terminals 104 and 105. In some embodiments, control circuit 101 may be further configured, in response to the assertion of switch signal 108, to change respective states of bidirectional control signals 107 to activate a "diode mode" of bidirectional switch 103 to allow current 109 to only flow in a single direction.

As described below, control circuit 101 may include an isolation circuit and a driver circuit. In various embodiments, control circuit 101 may additionally include a microcontroller, a state machine, or any other suitable sequential logic circuit.

Figure 2:
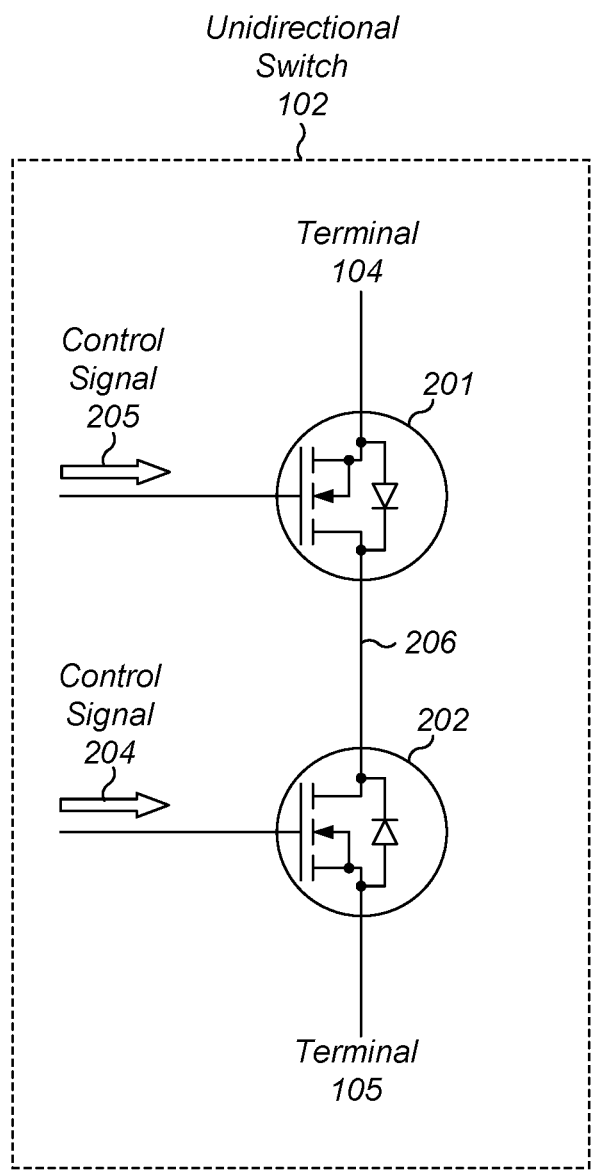
FIG. 2 is a block diagram of an embodiment of a unidirectional switch.

Turning to FIG. 2, a block diagram of unidirectional switch 102 is depicted. As illustrated, unidirectional switch 102 includes unidirectional switch device 201 and unidirectional switch device 202. Although only two unidirectional switch devices are depicted, in other embodiments, any suitable number of unidirectional switch devices may be employed.

Unidirectional switch device 201 is coupled between terminal 104 and node 206, and is controlled by control signal 205. In a similar fashion, unidirectional switch device 202 is coupled between node 206 and terminal 105, and is controlled by control signal 204. In various embodiments, control signals 204 and 205 may be included in unidirectional control signals 106 as depicted in FIG. 1.

In response to an assertion of control signal 205, unidirectional switch device 201 is configured to enable current to pass between terminal 104 and node 206. Depending on the orientation of unidirectional switch device 201, current may either flow from terminal 104 to node 206, or from node 206 to terminal 104. In a similar fashion, unidirectional switch device 202 is configured, in response to an assertion of control signals 204, to enable current to pass between node 206 and terminal 105.

It is noted that unidirectional switch device 201 and unidirectional switch device 202 are depicted as having their drains coupled together. In other embodiments, different arrangements of unidirectional switch device 201 and unidirectional switch device 202 are possible and contemplated. For example, in some embodiments, the drain of unidirectional switch device 201 may be coupled to the source of unidirectional switch device 202.

In various embodiments, unidirectional switch device 201 and unidirectional switch device 202 may be implemented using silicon carbide (SiC) devices, insulated-gate bipolar transistors (IGBTs), Gallium Nitride (GaN) transistors, or any other suitable wide bandgap transistors. In some embodiments, unidirectional switch devices 201 and 202 may be implemented using either a SiC device or GaN transistor along with a JFET arranged in a cascode configuration.

Figure 3:
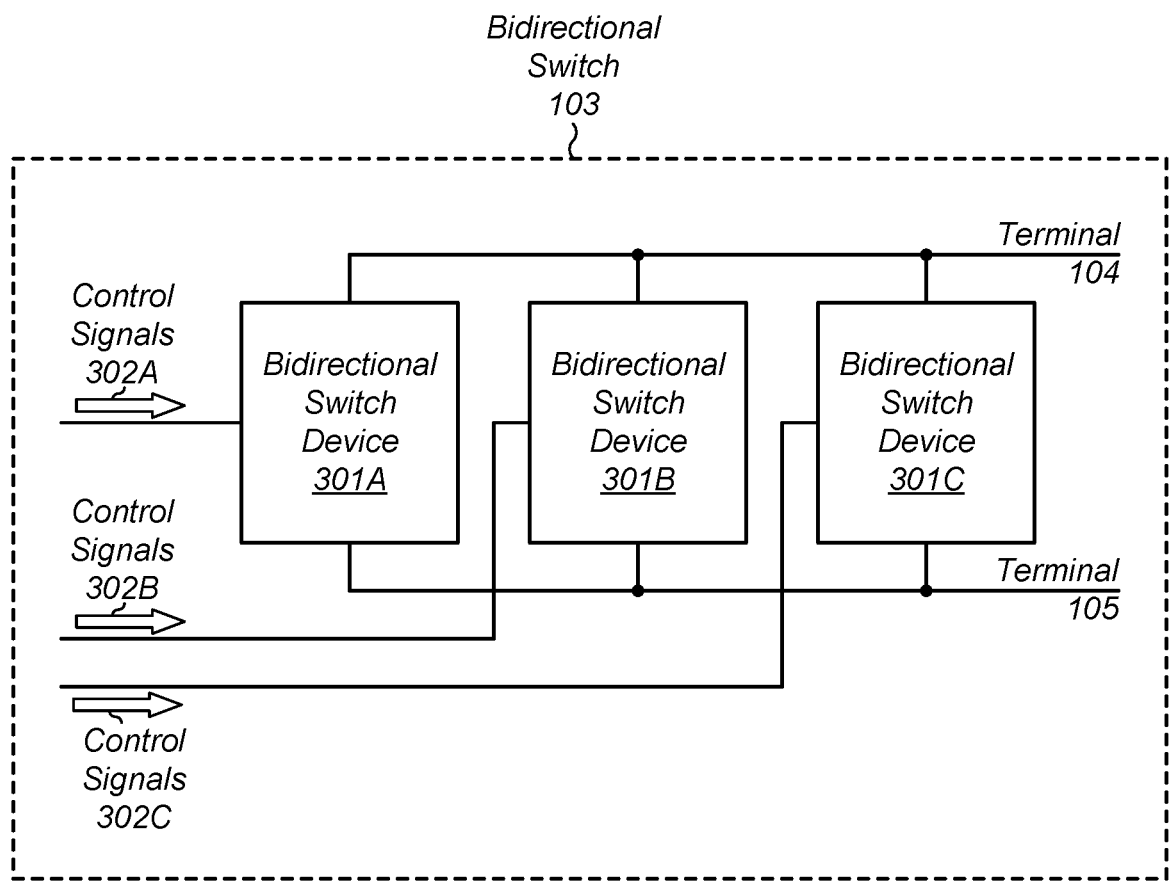
FIG. 3 is a block diagram of an embodiment of a bidirectional switch.

Turning to FIG. 3, a block diagram of bidirectional switch 103 is depicted. As illustrated, bidirectional switch 103 includes bidirectional switch devices 301A-301C. As described below, each of bidirectional switch devices 301A-301C can include at least one double-base bipolar device. Although only three bidirectional switch devices are depicted in the embodiment of FIG. 3, in other embodiments, any suitable number of bidirectional switch devices may be employed. In some embodiments, a number of bidirectional switch devices included in bidirectional switch 103 may be based on a desired level of current that is to be switched by bidirectional switch 103.

Each of bidirectional switch devices 301A-301C is coupled between terminal 104 and terminal 105. Bidirectional switch device 301A is controlled by control signals 302A, while bidirectional switch devices 301B and 301C are controlled by control signal 302B and 302C, respectively. Using different control signals for each of bidirectional switch devices 301A-301C, enables, in some embodiments, different ones of bidirectional switch devices 301A-301C to be opened and closed independently.

It is noted that while control signals 302A-302C are depicted as single wires, in various embodiments, control signals 302A-302C may include multiple wires for controlling different elements with bidirectional switch devices 301A-301C.

Figure 4:
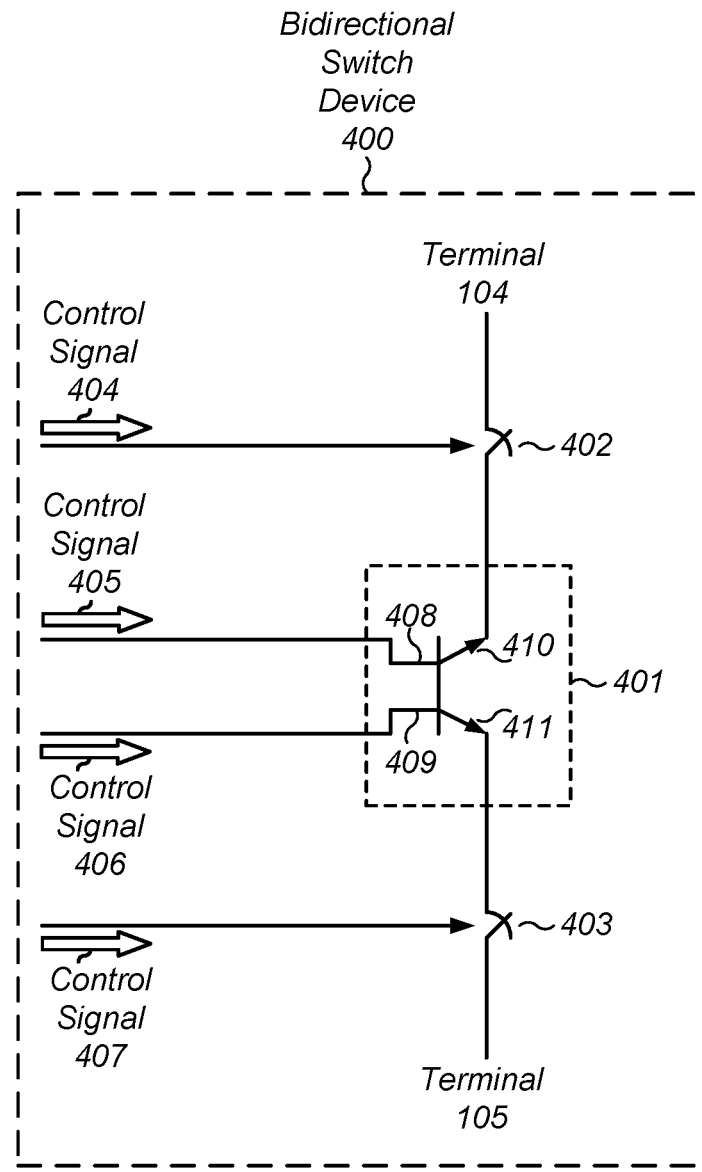
FIG. 4 is block diagram of an embodiment of a bidirectional switch device.

A block diagram of an embodiment of a bidirectional switch device is depicted in FIG. 4. As illustrated, bidirectional switch device 400 includes BDB BJT 401, switch 402, and switch 403. In various embodiments, BDB BJT 401 may be implemented as a B-TRAN™ available from Ideal Power Inc. of Austin, Texas. Although BDB BJT 401 is depicted as a PNP device, in other embodiments, BDB BJT 401 may also be implemented as an NPN device. Moreover, one example BDB BJT 401 may be a device as described in U.S. Provisional Patent Application No. 63/382,924, entitled "METHOD AND SYSTEMS OF OPERATING A PNP BIDIRECTIONAL DOUBLE-BASE BIPOLAR JUNCTION TRANSISTOR (B-TRAN)," filed on Nov. 9, 2022, in which the main load current flows through base connections. To avoid confusion, for purposes of this disclosure and the claims, the main load current is said to flow to and through collector-emitters, and control currents are applied to bases, even if, from a BJT device physics standpoint, the BJT is utilized as in the above-noted provisional application.

Switch 402 is coupled between terminal 104 and upper collector-emitter 410, and is configured to interrupt a current flow between terminal 104 and upper collector-emitter 410 based on control signal 404. In various embodiments, switch 402 may be implemented using a FET or any other suitable switching device.

Switch 403 is coupled between terminal 105 and lower collector-emitter 411, and is configured to interrupt a current flow between terminal 105 and lower collector-emitter 411 based on control signal 407. In various embodiments, switch 403 may be implemented using a FET or any other suitable switching device.

BDB BJT 401 is configured to conduct current through upper collector-emitter 410 and lower collector-emitter 411 based on a state of control signals 405 and 406. In various embodiments, different modes of operation of BDB BJT 401 may be achieved by changing the state of control signals 405 and 406, as well as the state of switches 402 and 403. For example, BDB BJT 401 may be placed in a "passive off" state by electrically floating control signal 405, which, in turn, electrically floats upper base 408. At the same time, upper collector-emitter 410 is coupled to terminal 104 via switch 402. Additionally, control signal 406 is coupled to terminal 105, which couples lower base 409 to terminal 105. Moreover, lower collector-emitter 411 is electrically floated by de-asserting control signal 407 and opening switch 403.

Alternatively, BDB BJT 401 may be placed in a "passive on" state by floating control signal 405, in order to electrically float upper base 408, while control signal 404 is asserted to close switch 402 to couple upper collector-emitter 410 to terminal 104. Additionally, lower base 409 may be electrically floated by placing control signal 406 in a high-impedance state, control signal 407 is asserted to close switch 403, thereby coupling lower collector-emitter 411 to terminal 105.

In various embodiments, control signals 404-407 may be included in bidirectional control signals 107 as depicted in FIG. 1. It is noted that, in addition to the "passive on" and "passive off" states, there are an additional four operation states, and of the six possible operational states for BDB BJT 401, any suitable subset of the operational states may be employed during operation of hybrid switch circuit 100.

Figure 5:
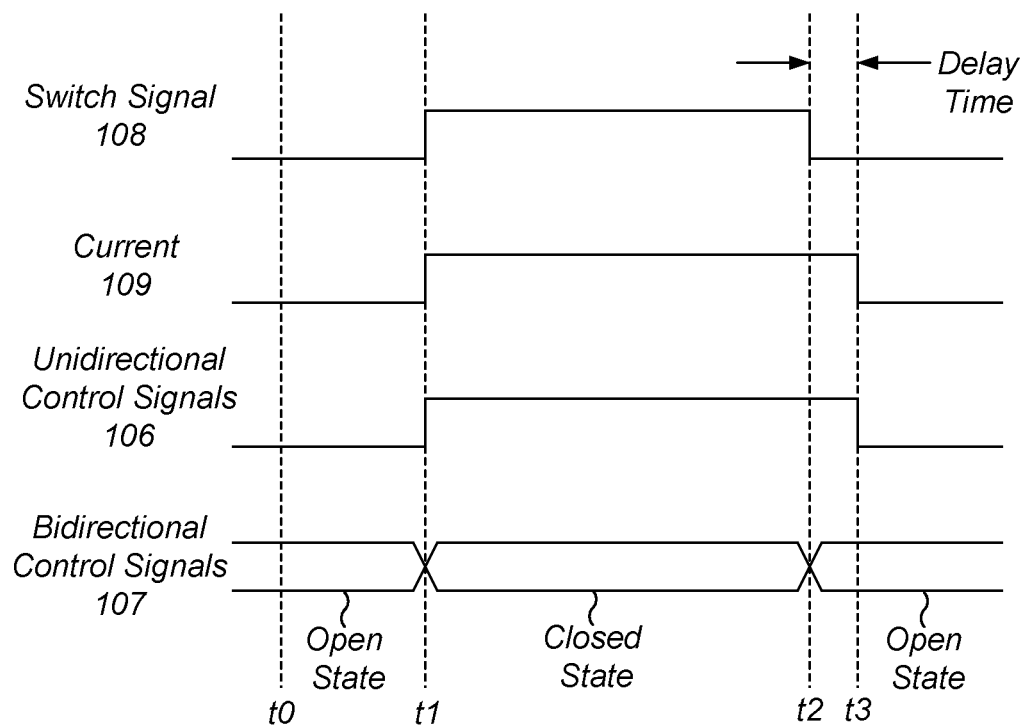
FIG. 5 illustrates example waveforms associated with the operation of a hybrid switch circuit.

Example waveforms associated with the operation of a hybrid switch circuit, e.g., hybrid switch circuit 100 as depicted in FIG. 1, are illustrated in FIG. 5. It is noted that the waveforms depicted in FIG. 5 are merely examples and that, in other embodiments, different relative timings between the various signals may be employed.

At time t0, switch signal 108 is not asserted, which keeps unidirectional control signals 106 de-asserted resulting unidirectional switch 102 being open, and bidirectional control signals 107 are in a state corresponding to bidirectional switch 103 being open. With both unidirectional switch 102 and bidirectional switch 103 open, current 109 is at or near zero. It is noted that, in some embodiments, both unidirectional switch 102 and bidirectional switch 103 may, even in their open states, allow a small amount of leakage current to flow. As such, current 109 may be non-zero even when both switches are open.

At time t1, switch signal 108 is asserted, which activates unidirectional control signals 106, which closes unidirectional switch 102. Additionally, bidirectional control signals 107 are placed in a state to close bidirectional switch 103. Once unidirectional switch 102 and bidirectional switch 103 are closed, current 109 can flow.

At time t2, switch signal 108 is de-asserted, which places bidirectional controls signals 107 in a state to open bidirectional switch 103. It is noted that unidirectional control signals 106 remain asserted at this time, maintaining the closed state of unidirectional switch 102. With unidirectional switch 102 closed, the difference in the respective voltages of terminal 104 and terminal 105 is minimized, so the power dissipated by bidirectional switch 103 as it closes is minimized, thereby improving the efficiency of hybrid switch circuit 100.

At time t3, unidirectional control signals 106 are de-asserted, closing unidirectional switch 102. As unidirectional switch 102 closes, current 109 decreases as the voltage between terminals 104 and 105 increases. Until current 109 stops flowing, unidirectional switch 102 is dissipating power. As described above, the switching speed of unidirectional switch 102 is faster than that of bidirectional switch 103, so the time during which hybrid switch circuit 100 is dissipating power is minimized.

The waveforms illustrated in FIG. 5 depict a single on/off cycle. In various embodiments, multiple on/off cycles may be performed back-to-back. The respective durations of the on-time and the off-time of any of the multiple on/off cycles may vary.

Figure 6:
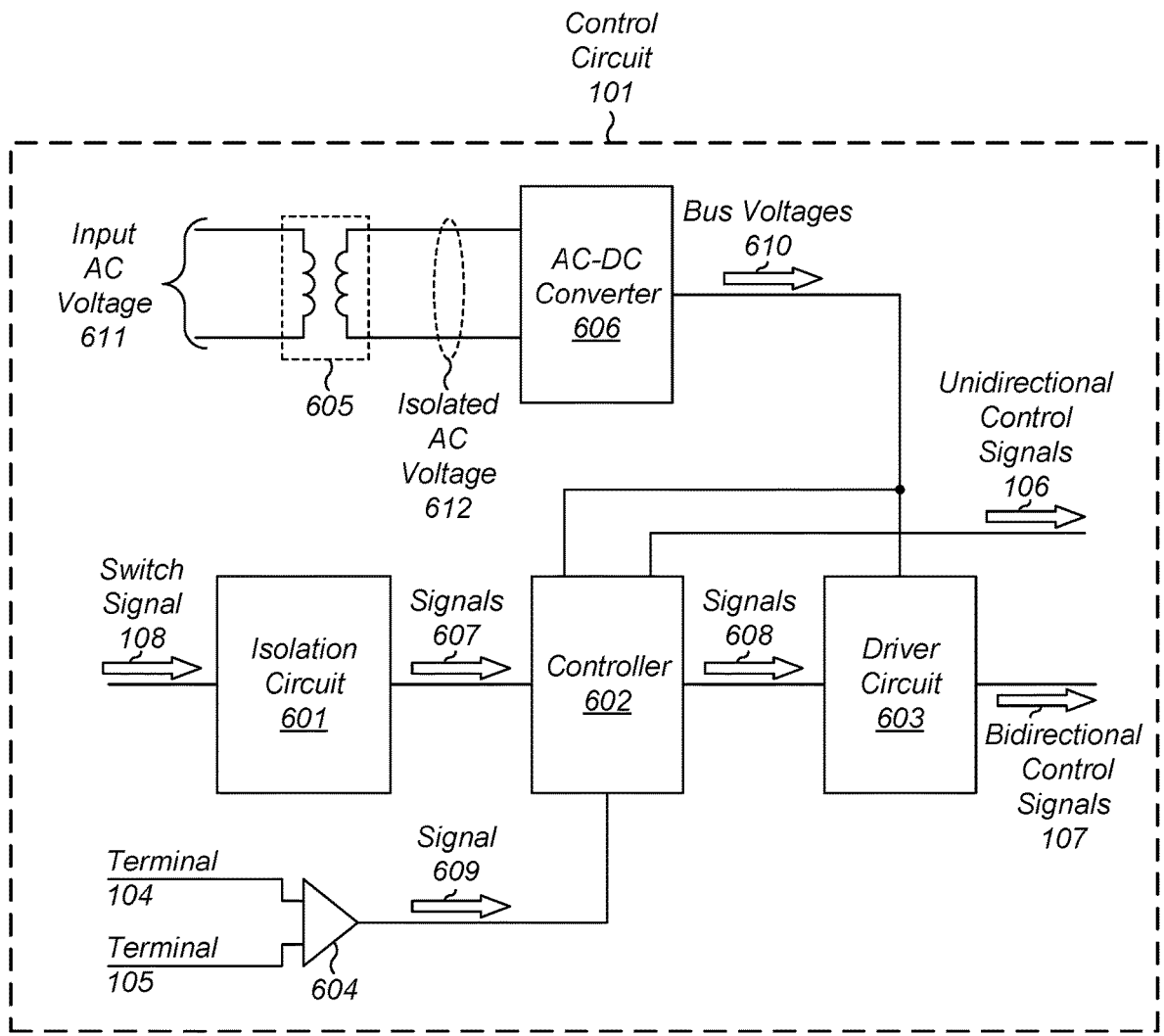
FIG. 6 is a block diagram of a control circuit included in a hybrid switch circuit.

Turning to FIG. 6, a block diagram of an embodiment of control circuit 101 is depicted. As illustrated, control circuit 101 includes isolation circuit 601, controller 602, driver circuit 603, comparator circuit 604, transformer 605, and AC-DC converter 606.

A primary winding of transformer 605 is coupled to input AC voltage 611. Transformer 605 is configured to generate isolated AC voltage 612 on its secondary winding based on input AC voltage 611. In some embodiments, transformer 605 may include a core made of ferrous material and/or one or more taps on the secondary winding. Although a single transformer is depicted in the embodiment of FIG. 6, in other embodiments, multiple transformers may be employed to provide different AC voltages to AC-DC converter 606.

AC-DC converter 606 is configured to generate bus voltages 610 using isolated AC voltage 612. In various embodiments, bus voltages 610 may include multiple voltage levels (e.g., 3.3V, 5V, 12V, and the like) for use by controller 602 and driver circuit 603 to generate the voltages for various ones of bidirectional control signals 107 to change an operating state of bidirectional switch devices 301A-301C. AC-DC converter 606 may, in some embodiments, be implemented using a rectifier circuit, one or more capacitors, one or more power converter circuits (e.g., buck converters), or any other suitable circuit components or sub-circuits.

In various embodiments, control circuit 101 may be in a different electrical domain than circuits that generate switch signal 108. To account for the difference in electrical domains, isolation circuit 601 is employed. In various embodiments, isolation circuit 601 is configured to generate signals 607 based on switch signal 108, such that signals 607 are in a different electrical domain from switch signal 108. Isolation circuit 601 may, in some embodiments, be implemented using optocouplers, capacitive isolation devices, or any other circuits configured to translate a signal from one electrical domain to another.

Comparator circuit 604 is configured to generate signal 609 based on respective voltage levels of terminals 104 and 105. In various embodiments, a voltage level of signal 609 may indicate which of terminals 104 and 105 has a greater voltage level. For example, in some cases, a particular voltage level of signal 609 may indicate that a voltage level of terminal 104 is greater than a voltage level of terminal 105, while a different voltage level of signal 609 may indicate that the voltage level of terminal 104 is less than the voltage level of terminal 105. In various embodiments, comparator circuit 604 may be implemented using a differential amplifier circuit, a Schmitt trigger circuit, or any other suitable circuit configured to generate an output signal whose voltage level is based on a comparison of respective voltage levels of at least two input signals.

Controller 602 is configured to generate signals 608 and unidirectional control signals 106 based on signals 607. As described above, in response to a de-assertion of switch signal 108 and a corresponding change in signals 607, controller 602 may be configured to change the state of signals 608 to place bidirectional switch devices 301A-301C in a closed state via bidirectional control signals 107. Controller 602 is further configured to change the state of unidirectional control signals 106 to close unidirectional switch 102 after time period 110 has elapsed since bidirectional switch devices 301A-301C were placed in a closed state.

In various embodiments, to generate signals 608 and unidirectional control signals 106, controller 602 may be further configured to generate signals 608 and unidirectional control signals 106 using one or more of the voltage levels included in bus voltages 610. As described below, signals 608 are used to operate various switches within driver circuit 603 to change the operating state or mode of bidirectional switch devices 301A-301C via bidirectional control signals 107.

In various embodiments, controller 602 may be implemented using individual circuit components, an application specific integrated circuit (ASIC), a microcontroller configured to execute software or program instructions, a reduced instruction set computer (RISC), a digital signal processor (DSP) circuit, a processor or processor core configured to execute software or program instructions, a programmable-logic device (PLD), a field programmable gate array (FPGA), a programmable system-on-a-chip (SoC), or any suitable combination thereof.

Driver circuit 603 is configured to generate bidirectional control signals 107 using signals 608 and one or more of the voltage levels include in bus voltages 610. As described above in regards to FIG. 4, different ones of bidirectional control signals 107 may be placed in a high impedance state allowing different terminals of BDB BJT 401 to electrically float. In other cases, driver circuit 603 may be configured to couple different ones of bidirectional control signals 107 to either terminal 104 or terminal 105, or set others of bidirectional control signals 107 to particular voltage levels, all under the control of signals 608. In various embodiments, driver circuit 603 may be implemented using multiple switches, FETs, or any other suitable switching devices.

Figure 7:
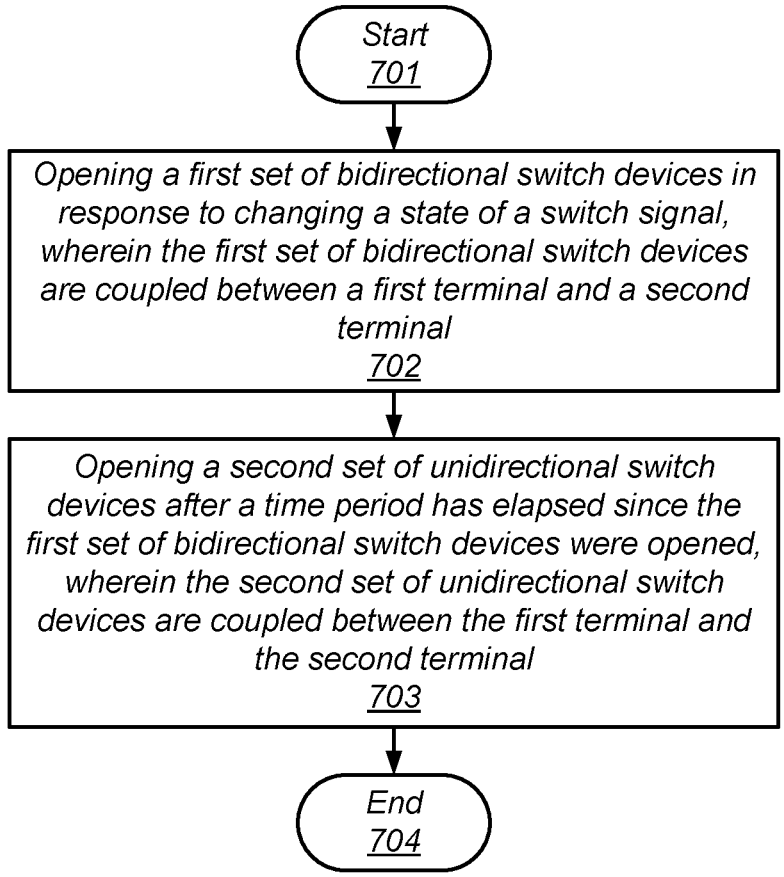
FIG. 7 is a flow diagram of an embodiment of a method for operating a hybrid switch circuit.

Turning to FIG. 7, a flow diagram depicting an embodiment of a method for operating a hybrid switch circuit is illustrated. The method, which begins at block 701 may be applied to various hybrid switch circuits including hybrid switch circuit 100 as depicted in FIG. 1.

The method includes opening a first set of bidirectional switch devices in response to changing a state of a switch signal (block 702). In various embodiments, the first set of bidirectional switch devices are coupled between a first terminal and a second terminal. In various embodiments, opening the first set of bidirectional switch devices may include generating a plurality of first switch signals using the control signal. In such cases, the method may further include opening the first set of bidirectional switch devices using corresponding ones of the plurality of first switch signals.

In some cases, the voltage levels of the control signal associated with different logic states are not compatible with the voltage levels being switched by the hybrid switch. In such cases, generating the plurality of first switch signals can include electrically isolating the control signal from a control circuit included in the hybrid switch, where the control circuit is configured to generate the first plurality of switch signals. In various embodiments, electrically isolating the control signal may include coupling the control signal from a first circuit domain to a second circuit domain via a transformer or other suitable circuit element.

In some cases, the first set of bidirectional switch devices includes a plurality of bidirectional double-base bipolar junction transistors coupled in parallel between the first terminal and the second terminal. The plurality of bidirectional double-base bipolar junction transistors may be implemented using an NPN structure, a PNP structure, or any other suitable bidirectional bipolar junction transistor structure.

The method further includes opening a second set of unidirectional switch devices after a time period has elapsed since the first set of bidirectional switch devices were opened (block 703). In some embodiments, opening the second set of unidirectional switch devices includes generating a delay corresponding to the time period using a delay circuit, a counter circuit, or any other suitable circuit.

In various embodiments, the second set of unidirectional switch devices are also coupled between the first terminal and the second terminal. In some embodiments, the second set of unidirectional switch devices may include a plurality of unidirectional switch devices coupled in series between the first terminal and the second terminal. The plurality of unidirectional switch devices may, in different embodiments, be implemented using cascode JFETs, silicon carbide (SiC) devices, insulated-gate bipolar transistors (IGBTs), or any other suitable wide bandgap transistors.

In some cases, opening the second set of unidirectional switch devices may include generating a plurality of second switch signals using the control signal. In various embodiments, the method may also include opening the second set of unidirectional switch devices using corresponding ones of the plurality of second switch signals.

In some embodiments, the method may further include closing a particular subset of the first set of bidirectional switch devices in response to asserting the switch signal. Additionally, the method may also include closing the second set of unidirectional switch devices in response to the asserting of the switch signal. The method concludes in block 704.

Figure 8:
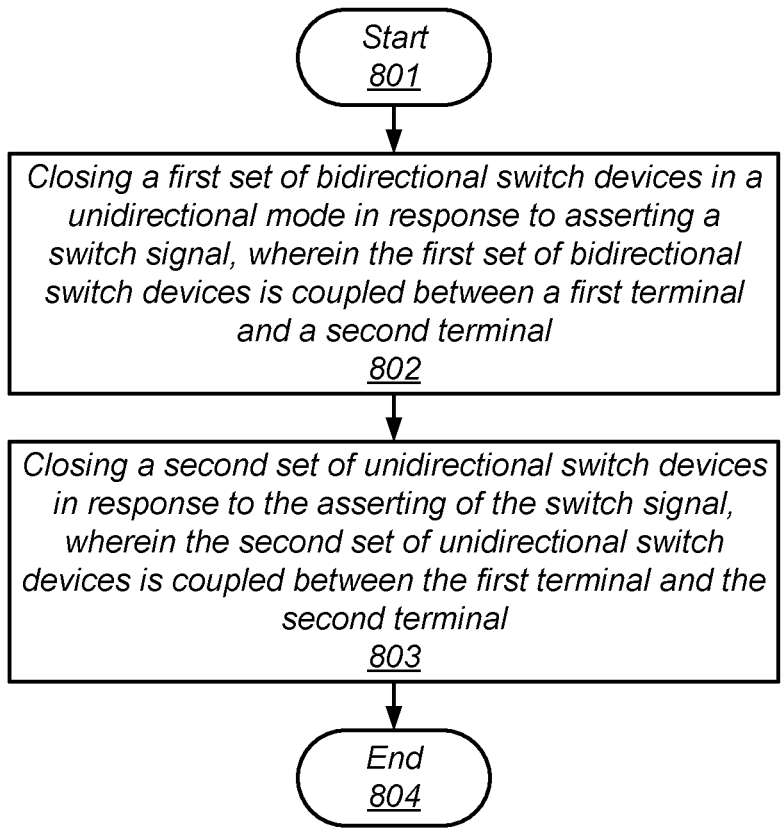
FIG. 8 is a flow diagram of an embodiment of a different method for operating a hybrid switch circuit.

As described above, a bidirectional switch may allow current to flow in either direction through the switch depending on respective voltages at the terminals of the hybrid switch. In some applications, e.g., rectification, it may be desirable to limit the direction of the current flowing through a hybrid switch to a single direction, while still maintaining the advantages of using double-base bipolar junction transistors. This may be accomplished by activating a "diode mode" of the bidirectional switch devices, in which current may only flow through the bidirectional switch devices in a single direction. A flow diagram depicting an embodiment of a different method for operating a hybrid switch is illustrated in FIG. 8. The method, which may be applied to various hybrid switch circuits including hybrid switch circuit 100, begins in block 800.

The method includes closing a first set of bidirectional switch devices in a unidirectional mode (or "diode mode") in response to asserting a switch signal (block 802). In various embodiments, the first set of bidirectional switch devices is coupled between a first terminal and a second terminal. In some embodiments, closing the first set of bidirectional switch devices in the unidirectional mode may include activating, in response to the asserting of the switch signal, a subset of a plurality of control signals coupled to the first set of bidirectional switch devices. In other embodiments, the method may further include determining a particular subset of a plurality of subsets of the plurality of control signals to activate based on one or more configuration bits.

As described above, the first set of bidirectional switch devices may include a plurality of double-base bipolar junction transistors coupled between the first terminal and the second terminal in parallel. In some cases, the closing of individual ones of the first set of bidirectional devices may be staggered to avoid a large current inrush.

The method also includes closing a second set of unidirectional switch devices in response to the asserting of the switch signal (block 803). In various embodiments, the second set of unidirectional switch devices is coupled between the first terminal and the second terminal.

As described above, the second set of unidirectional switch devices may be implemented using any suitable wide bandgap device, and may be coupled in series between the first terminal and the second terminal. In various embodiments, the orientation of the second set of unidirectional switch devices may be determined in order to match a direction of current flow through the first set of bidirectional switch devices operating in the unidirectional mode.

Although the steps of blocks 802 and 803 are depicted as being performed sequentially, in other embodiments, the steps of blocks 802 and 803 may be performed at substantially the same time. It is noted that opening the first set of bidirectional switch devices and the second set of unidirectional switch devices may, in various embodiments, be performed in a similar fashion as described in the flow diagram illustrated in FIG. 7. The method ends in block 804.

Figure 9:
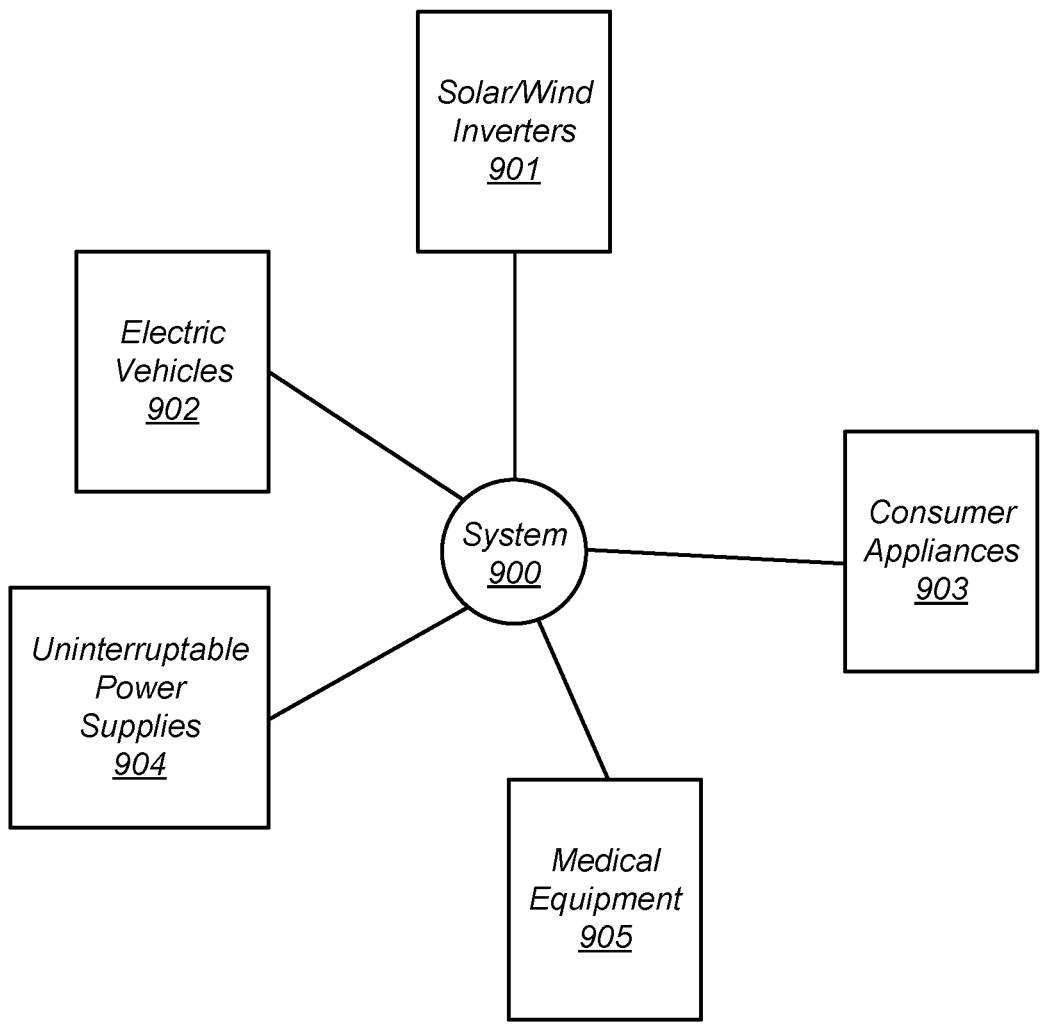
FIG. 9 is a block diagram of various embodiments of systems that may include a hybrid switch circuit.

Turning to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as consumer appliances 903 such as refrigerators, freezers, electric cooktops and ovens, heating, ventilation, and air conditioning (HVAC) equipment, and the like.

Similarly, disclosed elements may be utilized in medical equipment 905. Such medical equipment may include x-ray machines, magnetic resonance imaging (MRI) equipment, computed axial tomography (CAT) scanning equipment, and the like. Other types of devices are also contemplated, including any medical applications where switching high currents or voltages is needed.

System or device 900 may also be employed in other contexts. For example, system or device 900 may be utilized in the context of solar/wind inverters 901 or uninterruptable power supplies (UPSs) 904. Additionally, system or device 900 may be used in electric vehicles 902 such as electric cars, electric bicycles, electric scooters, and the like.

The applications illustrated in FIG. 9 are merely examples and not intended to limit the potential future applications of disclosed systems and devices.

The present disclosure includes references to "an embodiment" or groups of "embodiments." As used herein, embodiments are different implementations of instances of the disclosed concepts. References to "an embodiment," "some embodiments," and the like do not necessarily refer to the same embodiment. Many embodiments are possible and contemplated, including those specifically disclosed as well as modifications or alternatives that fall within the spirit or scope of the disclosure.

The above disclosure is meant to illustrate of the principles and various embodiments of the disclosed concepts. Numerous variations and modifications will become apparent to those skilled in the art once the above disclosure is fully appreciated. It is intended that the following claims be interpreted to embrace all such variations and modifications.

What is claimed is:

1. An apparatus, comprising:
a first set of bidirectional switch devices configured to couple a first terminal to a second terminal in response to a plurality of first control signals being placed in a first state, wherein the plurality of first control signals is coupled to the first set of bidirectional switch devices;
a second set of unidirectional switch devices coupled between the first terminal and the second terminal, wherein the second set of unidirectional switch devices is configured to couple, through the second set of unidirectional switch devices, the first terminal to the second terminal in response to an assertion of a plurality of second control signals, wherein the plurality of second control signals is coupled to the second set of unidirectional switch devices; and
a control circuit configured, in response to a de-assertion of a switch signal, to:
place the plurality of first control signals in a second state corresponding to an open state of the first set of bidirectional switch devices; and
de-assert the plurality of second control signals after a time period has elapsed since the first plurality of control signals were placed in the second state.

2. The apparatus of claim 1, wherein the first set of bidirectional switch devices includes a plurality of double-base bipolar junction transistors coupled in parallel between the first terminal and the second terminal.

3. The apparatus of claim 1, wherein the second set of unidirectional switch devices includes a plurality of wide bandgap transistors coupled in series between the first terminal and the second terminal.

4. The apparatus of claim 1, wherein the control circuit is further configured to electrically isolate the switch signal from a controller circuit and a driver circuit coupled to the first set of bidirectional switch devices.

5. The apparatus of claim 1, wherein the first set of bidirectional switch devices are coupled to corresponding subsets of the plurality of first control signals, and wherein a given bidirectional switch device of the first set of bidirectional switch devices is configured to couple the first terminal to the second terminal in response to a corresponding subset of the plurality of first control signals being placed in the first state.

6. The apparatus of claim 1, wherein the control circuit is further configured, in response to an assertion of the switch signal, to sequentially place a plurality of subsets of the plurality of first control signals in the first state.

7. A method, comprising:
opening a first set of bidirectional switch devices in response to changing a plurality of first switch signals responsive to a state of a control signal, wherein the first set of bidirectional switch devices are coupled between a first terminal and a second terminal; and
after a time period has elapsed since the first set of bidirectional switches was opened, opening a second set of unidirectional switch devices by changing a plurality of second switch signals coupled to the second set of unidirectional switch devices, wherein the second set of unidirectional switch devices is coupled between the first terminal and the second terminal, and wherein the second set of unidirectional switch devices is configured to couple, through the second set of unidirectional switch devices, the first terminal to the second terminal.

8. The method of claim 7, wherein the first set of bidirectional switch devices includes a plurality of double-base bipolar junction transistors coupled in parallel between the first terminal and the second terminal.

9. The method of claim 7, wherein the second set of unidirectional switch devices includes a plurality of wide bandgap transistors coupled in series between the first terminal and the second terminal.

10. The method of claim 7, wherein opening the first set of bidirectional switch devices includes:
opening the first set of bidirectional switch devices using corresponding ones of the plurality of first switch signals.

11. The method of claim 10, wherein generating the plurality of first switch signals includes electrically isolating the control signal from a control circuit configured to generate the plurality of first switch signals.

12. The method of claim 7, wherein opening the second set of unidirectional switch devices includes generating the plurality of second switch signals using the control signal.

13. The method of claim 7, further comprising:
closing a particular subset of the first set of bidirectional switch devices in response to asserting the control signal; and
closing the second set of unidirectional switch devices in response to asserting the control signal.

14. An apparatus, comprising:
a first terminal;
a second terminal; and
a hybrid switch circuit coupled between the first terminal and the second terminal, wherein the hybrid switch circuit includes a first set of bidirectional switch devices and a second set of unidirectional switch devices coupled between the first terminal and the second terminal, wherein the hybrid switch circuit is configured to:
using a plurality of first switch signals, open a first set of bidirectional switch devices in response to changing a state of a control signal; and
using a plurality of second switch signals coupled to a second set of unidirectional switch devices, open the second set of unidirectional switch devices after a time period has elapsed since the first set of bidirectional switch devices was opened, wherein the second set of unidirectional switch devices is configured to couple, through the second set of unidirectional switch devices, the first terminal to the second terminal.

15. The apparatus of claim 14, wherein the first set of bidirectional switch devices includes a plurality of double-base bipolar junction transistors coupled in parallel between the first terminal and the second terminal.

16. The apparatus of claim 14, wherein the second set of unidirectional switch devices includes a plurality of wide bandgap transistors coupled in series between the first terminal and the second terminal.

17. The apparatus of claim 14, wherein to open the first set of bidirectional switch devices, the hybrid switch circuit is further configured to:
generate the plurality of first switch signals using the control signal; and
open the first set of bidirectional switch devices using corresponding ones of the plurality of first switch signals.

18. The apparatus of claim 17, wherein the hybrid switch circuit includes a control circuit configured to generate the plurality of first switch signals, and wherein to generate the plurality of first switch signals, the hybrid switch circuit is configured to isolate the control signal from the control circuit electrically.

19. The apparatus of claim 14, wherein to open the second set of unidirectional switch devices, the hybrid switch circuit is configured to generate a plurality of second switch signals using the control signal.

20. The apparatus of claim 14, wherein the hybrid switch circuit is further configured to:
close a particular subset of the first set of bidirectional switch devices in response to asserting the control signal; and
close the second set of unidirectional switch devices in response to asserting the control signal.

\* \* \* \* \*